(12) United States Patent
Choi et al.

(10) Patent No.: US 10,965,214 B2
(45) Date of Patent: *Mar. 30, 2021

(54) POWER MANAGEMENT INTEGRATED CIRCUIT FOR SUPPLYING LOAD CURRENT INFORMATION AND ELECTRONIC DEVICE HAVING THE SAME

(71) Applicant: Samsung Electronics Co., Ltd., Suwon-si (KR)

(72) Inventors: Minho Choi, Seoul (KR); Yus Ko, Yongin-si (KR); Dongjin Keum, Suwon-si (KR); Hwa Yeal Yu, Bucheon-si (KR); Younghoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/243,495

(22) Filed: Jan. 9, 2019

(65) Prior Publication Data

US 2019/0149045 A1 May 16, 2019

Related U.S. Application Data

(63) Continuation of application No. 14/872,285, filed on Oct. 1, 2015, now Pat. No. 10,205,388.

(30) Foreign Application Priority Data

Oct. 17, 2014 (KR) .................... 10-2014-0140484

(51) Int. Cl.
*G05F 1/10* (2006.01)
*G05F 3/02* (2006.01)
(Continued)

(52) U.S. Cl.
CPC ........ *H02M 3/158* (2013.01); *G01R 19/0092* (2013.01); *H02M 3/1584* (2013.01); *H02M 2001/008* (2013.01)

(58) Field of Classification Search
CPC ...... H02J 3/14; Y02B 70/3225; Y04S 20/222; G06F 1/26; H01R 25/003; G11C 5/147;
(Continued)

(56) References Cited

U.S. PATENT DOCUMENTS 5,291,197 A 3/1994 Abe
7,161,333 B2 1/2007 Soch
(Continued)

FOREIGN PATENT DOCUMENTS

CN 102958251 3/2013
KR 10-2010-0098826 A 9/2010
(Continued)

*Primary Examiner* — Quan Tra
*Assistant Examiner* — Anh-Quan Tra
(74) *Attorney, Agent, or Firm* — Harness, Dickey & Pierce, P.L.C.

(57) ABSTRACT

An electronic device includes a power management integrated circuit (PMIC) including a plurality of regulators. Each of the plurality of regulators has a current meter configured to measure a respective load current. A load device is configured to receive real-time load current information from the PMIC and to perform a performance improvement operation based on the real-time load current information.

20 Claims, 14 Drawing Sheets

(51) Int. Cl.
  *H02M 3/158* (2006.01)
  *G01R 19/00* (2006.01)
  *H02M 1/00* (2006.01)

(58) Field of Classification Search
  CPC .......... G05F 1/465; G05F 3/205; G05F 3/262; H04B 1/1623
  USPC .............................. 307/38–39; 327/530, 538
  See application file for complete search history.

(56) References Cited

U.S. PATENT DOCUMENTS

| | | | |
|---|---|---|---|
| 7,679,350 B2 | 3/2010 | Falvey et al. | |
| 7,936,160 B1 | 5/2011 | Sheehan | |
| 7,952,336 B2 | 5/2011 | Brinkman | |
| 8,026,636 B2 | 9/2011 | Oh | |
| 8,179,113 B2 | 5/2012 | Singnurkar | |
| 8,310,793 B2 | 11/2012 | Jenkner et al. | |
| 8,368,248 B2 | 2/2013 | Davis et al. | |
| 8,487,595 B2 | 7/2013 | Popescu et al. | |
| 8,508,208 B2 | 8/2013 | Klein | |
| 8,581,659 B2 | 11/2013 | Ulbrich et al. | |
| 8,604,767 B2 | 12/2013 | Liu | |
| 8,688,289 B2 | 4/2014 | Salsbery et al. | |
| 8,780,587 B2 | 7/2014 | Liao et al. | |
| 8,928,299 B2 | 1/2015 | Matzberger et al. | |
| 2006/0119338 A1 | 6/2006 | Soch | |
| 2007/0279024 A1 | 12/2007 | Falvey et al. | |
| 2009/0128109 A1 | 5/2009 | Brinkman | |
| 2010/0219687 A1 | 9/2010 | Oh | |
| 2010/0327833 A1 | 12/2010 | Singnurkar | |
| 2011/0019315 A1 | 1/2011 | Jenkner et al. | |
| 2011/0057637 A1 | 3/2011 | Liu | |
| 2011/0105867 A1 | 5/2011 | Schultz et al. | |
| 2011/0109159 A1 | 5/2011 | Davis et al. | |
| 2011/0181256 A1 | 7/2011 | Ulbrich et al. | |
| 2012/0249098 A1 | 10/2012 | Popescu et al. | |
| 2013/0049599 A1 | 2/2013 | Logiudice | |
| 2013/0114308 A1 | 5/2013 | Liao et al. | |
| 2013/0169046 A1* | 7/2013 | Shin | H02J 9/062 307/23 |
| 2013/0283083 A1 | 10/2013 | Vilhauer et al. | |
| 2013/0314067 A1 | 11/2013 | Matzberger et al. | |
| 2014/0266123 A1 | 9/2014 | Rader | |
| 2014/0347028 A1 | 11/2014 | Jayaraj et al. | |
| 2015/0234452 A1* | 8/2015 | Heo | G06F 1/3296 713/320 |
| 2015/0382422 A1 | 12/2015 | Ho et al. | |
| 2016/0054788 A1* | 2/2016 | Gulati | G06F 1/3296 713/323 |
| 2017/0068296 A1* | 3/2017 | Mair | G06F 1/28 |

FOREIGN PATENT DOCUMENTS

| | | |
|---|---|---|
| KR | 10-2012-0003398 A | 1/2012 |
| KR | 10-2014-0045548 A | 4/2014 |

* cited by examiner

POWER MANAGEMENT INTEGRATED CIRCUIT FOR SUPPLYING LOAD CURRENT INFORMATION AND ELECTRONIC DEVICE HAVING THE SAME

CROSS-REFERENCE TO RELATED APPLICATIONS

This application is a continuation application of and claims priority under 35 U.S.C. § 120/121 to U.S. application Ser. No. 14/872,285 filed Oct. 1, 2015, which claims priority under 35 U.S.C. § 119 to Korean Patent Application No. 10-2014-0140484 filed Oct. 17, 2014, in the Korean Intellectual Property Office, the entire contents of each of which are hereby incorporated by reference herein.

BACKGROUND

At least one example embodiment of inventive concepts relates to a semiconductor device, and more particularly, relate to a power management integrated circuit for supplying load current information and/or an electronic device having the same.

A power circuit is a circuit for driving various electronic devices. Nowadays, as the use of mobile devices increases, the demand for high efficiency DC-DC converters increases. It is desirable to use DC-DC converters in which an effect of a resistor component is minimized to reduce power consumption caused by a voltage drop across the resistor. One way to do so is to employ a switching converter, which uses an inductor for easily obtaining a target level of voltage while minimizing power consumption.

The switching converter includes a buck converter to transform a high direct current (DC) voltage into a lower DC voltage and a boost converter to boost the DC voltage. The switching converter that uses an inductor has a lower power consumption than the DC-DC converter using a resistor, and thus, the switching converter may have a high energy efficiency. Further, the DC-DC converter may include a low drop-out (LDO) regulator composed of a linear regulator.

Recent power management integrated circuits (PMICs) integrate the above mentioned regulators to supply power to load devices. However, the PMIC in a mobile device should provide real-time power information to the load devices to reduce power consumption and improve performance of the load devices.

SUMMARY

At least one example embodiment of the inventive concepts is directed to a power device capable of supplying a desired magnitude of current to a load device in real time.

Example embodiments of inventive concepts are not limited to this disclosure, other example embodiments may become apparent to those of ordinary skill in the art based on the following descriptions.

According to at least one example embodiment, an electronic device includes a power management integrated circuit (PMIC) including a plurality of regulators. Each of the plurality of regulators has a current meter configured to measure a respective load current. The electronic device includes a load device configured to receive real-time load current information from the PMIC and to perform a performance improvement operation based on the real-time load current information.

According to at least one example embodiment, the PMIC is configured to measure a load current output from at least one of the plurality of regulators in response to a request from the load device and supply the measured load current as the load current information.

According to at least one example embodiment, each of the plurality of regulators includes a switching regulator configured to switch an input voltage and supply the switched input voltage to the load device. The current meter is configured to calculate an average value of the switching current and supply the average value as the load current.

According to at least one example embodiment, each of the plurality of regulators includes a boost converter or a buck-boost converter. The current meter is configured to detect a drain-source voltage of a transistor for switching between an inductor of the boost converter or the buck-boost converter and an output terminal, and output the detected drain-source voltage as the load current.

According to at least one example embodiment, each of the plurality of regulators includes a buck converter. The current meter is configured to detect an inductor current of the buck converter and output the detected inductor current as the load current.

According to at least one example embodiment, the PMIC comprises a selector configured to select load current information of each of the plurality of regulators according to selection information from the load device. The PMIC includes an analog digital converter configured to transform the selected load current information into a digital signal. The PMIC includes control logic configured to control the selector according to the selection information and to store the digital signal as the load current information.

According to at least one example embodiment, the control logic includes a plurality of registers configured to store the load current information.

According to at least one example embodiment, the PMIC includes an interrupt generator configured to supply a ready signal to the load device if detection of the load current information requested from the load device is complete.

According to at least one example embodiment, the PMIC includes an interface configured to receive request information from the load device and supply the load current information to the load device.

According to at least one example embodiment, the performance improvement operation includes at least one of a thermal throttling operation, a power control operation, or a dynamic voltage and frequency scaling (DVFS) operation.

According to at least one example embodiment, a method includes requesting, by the load device, load current information from the PMIC. The method includes detecting, by the PMIC, an output current of a regulator supplying power to the load device. The method includes supplying the detected output current to the load device as the load current information. The method includes performing, by the load device, a performance improvement operation using the load current information.

According to at least one example embodiment, the detecting includes measuring, by a current meter of the PMIC, the output current of the regulator.

According to at least one example embodiment, the current meter is configured to average a varying output current of the regulator and supply the averaged output current as the output current.

According to at least one example embodiment, the requesting of load current information includes supplying selection information and configuration information to the PMIC, the selection information being for selecting at least one of the plurality of regulators and the configuration information being for detecting current.

According to at least one example embodiment, the supplying of the detected output current includes transforming the detected output current into the load current information that is a digital signal, storing the load current information to a register included in the PMIC, and transferring the load current information stored in the register to the load device.

According to at least one example embodiment, the method includes detecting whether a driving temperature of the load device exceeds a reference value before requesting the load current information.

According to at least one example embodiment, the requesting the load information is performed if the driving temperature exceeds the reference value.

According to at least one example embodiment, the performance improvement operation includes at least one of a thermal throttling operation, a power control operation, or a dynamic voltage and frequency scaling (DVFS) operation.

According to at least one example embodiment, a switching regulator includes an inductor configured to receive the DC input voltage at a first terminal, a first transistor configured to switch between a second terminal of the inductor and a ground voltage, a second transistor configured to switch between the second terminal of the inductor and an output terminal, and a current meter configured to sense a differential voltage of a drain-source node of the second transistor and to supply the sensed differential voltage as load current information.

According to at least one example embodiment, the first transistor and the second transistor are complementarily driven.

According to at least one example embodiment, the current meter comprises an input selector configured to receive the differential voltage if the second transistor is turned on, a voltage-current converter configured to transform the differential voltage selected by the input selector into a current signal, and a low pass filter (LPF) configured to transform the current signal into a signal having a constant level and supply the signal having the constant level as the load current information.

According to at least one example embodiment, the input selector comprises a first switch configured to transmit a voltage of a drain-source node of the second transistor to an input terminal of the voltage-current converter if the second transistor is turned on, and a second switch configured to short drain and source nodes of the second transistor if the second transistor is turned off.

According to at least one example embodiment, the switching regulator includes a switch component configured to switch the DC input voltage to a terminal of the inductor.

According to at least one example embodiment, a switching regulator includes an inductor, a first transistor configured to transmit the DC input voltage by switching a terminal of the inductor, a second transistor connected between the terminal of the inductor and a ground voltage, and a current meter configured to supply a load current to the terminal of the inductor, the load current having a DC current level.

According to at least one example embodiment, the current meter comprises a current sensor configured to detect the load current flowing to the terminal of the inductor, a pseudo current generator configured to detect a peak value of the detected current and generate a pseudo current with a square wave form, and an averaging circuit configured to calculate an average value of the pseudo current and supply the calculated average value as the load current having the DC current level.

According to at least one example embodiment, the pseudo current generator is configured to generate the pseudo current based on the peak value and a driving signal of at least one of the first transistor and the second transistor.

According to at least one example embodiment, the current meter includes a current limiter configured to supply a peak value of the load current as a fixed value and calculate the load current using the fixed peak value.

According to at least one example embodiment, a power manager includes an interface configured to receive a request for load current information, the request including selection information associated with a load device. The power manager includes control logic configured to generate a selection signal based on the selection information. The power manager includes a selector configured to select at least one of a plurality of regulators based on the selection signal. The plurality of regulators are configured to generate respective output signals. The selector is configured to output an output signal of the at least one selected regulator.

According to at least one example embodiment, the power manager includes an analog to digital converter configured to convert the output signal to a digital signal.

According to at least one example embodiment, the control logic is configured to store the digital signal.

According to at least one example embodiment, the power manager includes an interrupt generator configured to output an interrupt signal such that the load device is prepared to receive the load current information.

According to at least one example embodiment, the interface is configured to send the stored digital signal as the load current information based on the interrupt signal.

The inventive concepts may provide magnitude information of load current requested from a load device to the load device in real time. Accordingly, a mobile device capable of supporting various powers, a temperature, and a service quality maintenance operation performed in the load device may be implemented.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION OF EXAMPLE EMBODIMENTS

Figure 1:
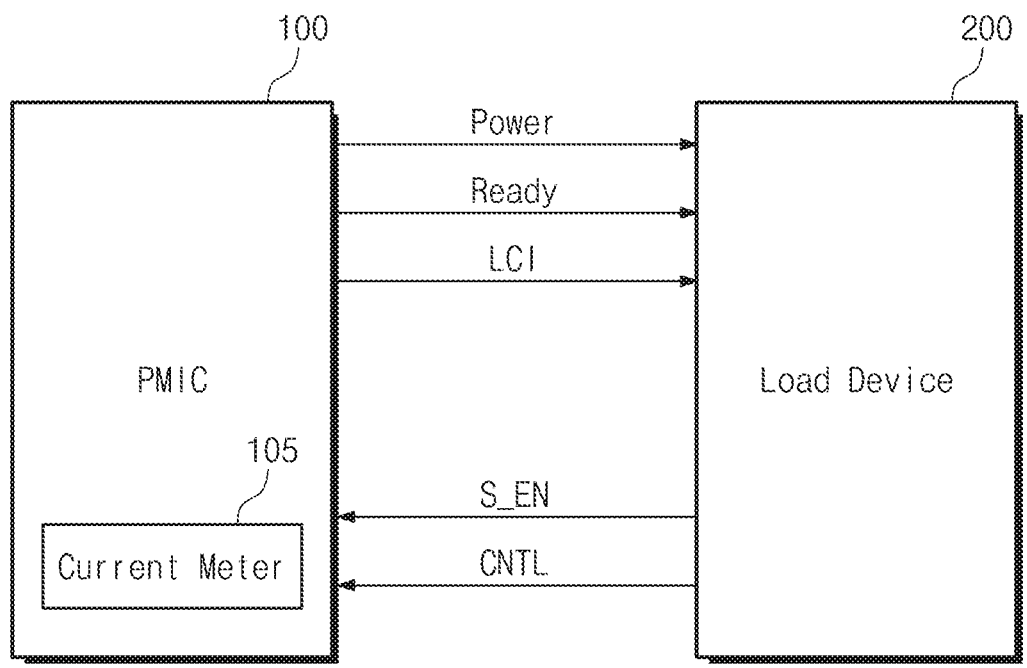
FIG. 1 is a block diagram illustrating a mobile device according to at least one example embodiment of the inventive concepts.

Inventive concepts will now be described more fully with reference to the accompanying drawings, in which example embodiments of are shown. These example embodiments are provided so that this disclosure will be thorough and complete, and will fully convey inventive concepts of to those skilled in the art. Inventive concepts may be embodied in many different forms with a variety of modifications, and a few embodiments will be illustrated in drawings and explained in detail. However, this should not be construed as being limited to example embodiments set forth herein, and rather, it should be understood that changes may be made in these example embodiments without departing from the principles and spirit of inventive concepts, the scope of which are defined in the claims and their equivalents. Like numbers refer to like elements throughout. In the drawings, the thicknesses of layers and regions are exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., electronic imaging systems, image processing systems, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible or non-transitory machine readable mediums for storing information. The term "computer-readable medium" may include, but is not limited to, portable or fixed storage devices, optical storage devices, and various other tangible or non-transitory mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram illustrating a mobile device according to at least one example embodiment of the inventive concepts. Referring to FIG. 1, a mobile device includes a power management integrated circuit (PMIC) (or power manager) 100 and a load device 200. The PMIC 100 may provide load current information (LCI) according to a request of the load device 200.

The PMIC 100 may include DC-DC converters and/or regulators. The PMIC 100 may provide a magnitude of load current provided to the load device 200 according to the request of the load device 200 in real time. The PMIC 100 includes a current meter 105 for these functions. The PMIC 100 may measure the load current according to the request of the load device 200 and provides the measured value to the load device 200.

Firstly, the PMIC 100 receives a sense request signal S_EN with respect to the load current and a control signal CNTL from the load device 200. Here, the control signal CNTL includes selection information for selecting any one of the plurality of regulators and information about a time or a parameter for calculating average current. That is, the control signal CNTL may include configuration information for measuring the load current by the current meter 105. For example, the control signal CNTL may include time information for calculating a sampling period with respect to the load current or average current value of a switching regulator.

The PMIC 100 measures and calculates the load current outputted from a linear or switching regulator selected based on the control signal CNTL. Moreover, the PMIC 100 may provide a magnitude of the load current outputted from the measured and calculated linear or switching regulator to the load device 200 as the load current information LCI. Here, the load current information LCI may be transmitted to the load device 200 as a digital data form or an analog signal form.

The load device 200 may perform various operations using a power provided from the PMIC 100. For example, the load device 200 may perform an operation for various service quality improvement or performance improvement based on the real-time load current information LCI from the PMIC 100. The load device 200 may perform a temperature control operation, such as thermal throttling, using the load current information LCI provided in real time. As a magnitude of load current increases, power consumption increases, and a temperature of the load device 200 increases. Accordingly, when using the load current information LCI provided in real time, the load device 200 may speedily and precisely perform exothermic control. A practical use example of the load current information LCI of the load device 200 is not limited to thermal throttling, and various other applications are possible.

The load device 200 may periodically request the load current information LCI from the PMIC 100. That is, the load device 200 may transmit the sense request signal S_EN of the load current and the control signal CNTL to the PMIC 100 to obtain the load current information LCI. Then, the PMIC 100 measures and calculates the load current with respect to a selected and requested regulator by the load device 200. When the calculation with respect to the load current is complete, the PMIC 100 provides a ready signal Ready to the load device 200. In response to the ready signal Ready, the load device 200 fetches or receives the load current information LCI from the PMIC 100.

In case of using the measured and calculated load current information in real time, the load current information LCI having higher availability and accuracy than information obtained by prediction may be provided. Accordingly, various applications such as thermal throttling and power management in which a magnitude of a real-time load current is used may be possible.

Figure 2:
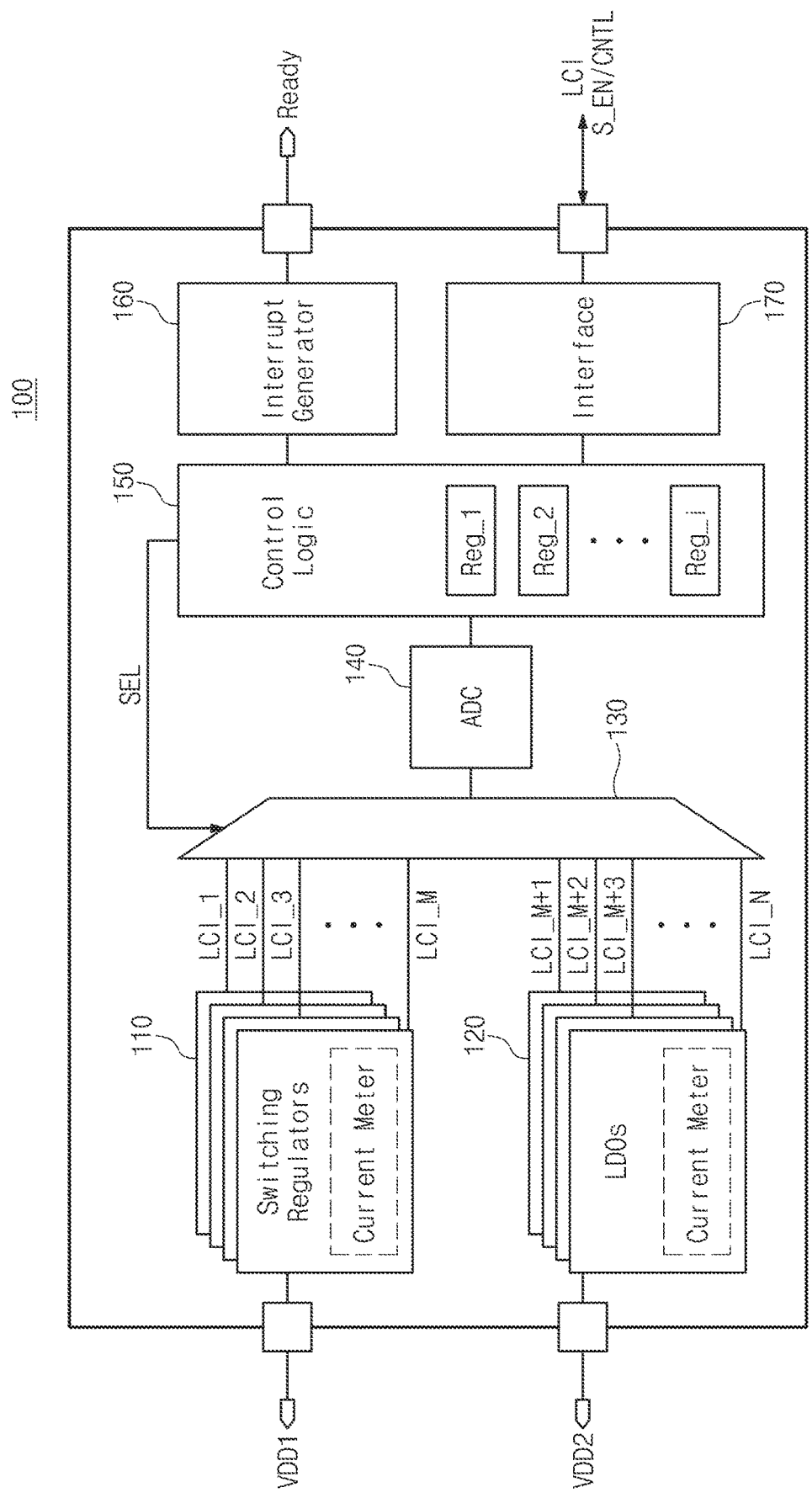
FIG. 2 is a block diagram illustrating an example structure of a PMIC 100 shown in FIG. 1.

FIG. 2 is a block diagram illustrating an example structure of a PMIC 100 shown in FIG. 1. Referring to FIG. 2, the PMIC 100 includes a plurality of regulators 110 and 120, each having a respective current meter. Moreover, the PMIC 100 includes a selector 130 for serving measured load current information LCI to a load device 200 (not shown), an analog-digital converter (ADC) 140, control logic 150, an interrupt generator 160, and an interface unit (or interface) 170.

The switching regulators 110 may include at least one switching regulator. For example, the switching regulators 110 may include at least one of a boost converter, a buck-boost converter, and a buck converter. Each of the switching regulators 110 includes a current meter. Moreover, each of the switching regulators 110 may output measurement signals LCI_1 to LCI_M (e.g., where M is an integer) through the current meter. The measurement signals LCI_1 to LCI_M may have level information of a load current and may be an electric signal.

The LDO regulators 120 may include at least one LDO regulator. Each of the LDO regulators 120 may be implemented with linear regulators capable of controlling a magnitude of voltage drop according to a level of output voltage. Moreover, each of the LDO regulators 120 includes a current meter. Load current measured by the respective current meter may be based on measurement signals LCI_M+1 to LCI_N. The measurement signals LCI_M+1 to LCI_N may be outputted with an electrical signal having level information of a load current with respect to each of the LDO regulators 120.

The selector 130 selects at least one of the measurement signals LCI_1 to LCI_N outputted from the switching regulators 110 or the LDO regulators 120 in response to a selection signal SEL from the control logic 150. For example, the selector 130 may be implemented with a multiplexer.

The ADC 140 transforms at least one of measurement signals LCI_1 to LCI_N selected by the selector 130 into a digital signal. That is, the ADC 140 may transform the measurement signal LCI_1 to LCI_N having a magnitude of load current into a discrete signal or a digital code. The selected signal of the measurement signals LCI_1 to LCI_N transformed into a digital signal is transmitted to the control logic 150.

The control logic 150 may receive a sense request signal S_EN of load current and a control signal CNTL from the load device 200 supplied through the interface unit 170. In response to the sense request signal S_EN and the control signal CNTL, the control logic 150 may select at least one of the measurement signals LCI_1 to LCI_N of the load current outputted from the regulators 110 and 120. The control logic 150 may generate the selection signal SEL for selecting at least one of the measurement signals LCI_1 to LCI_N and supply the selection signal SEL to the selector 130. The selection signal SEL may be implemented with a code for selecting an output of a multiplexer.

The control logic 150 may include a plurality of registers Reg_1 to Reg_i (e.g., "i" is an integer). The plurality of registers Reg_1 to Reg_i may store load current information LCI of a regulator selected by request from the load device 200. For example, some load current information LCI_x selected from the switching regulators 110 may be stored in a first register Reg_1. Some load current information LCI_y selected from the LDO regulators 120 may be stored in a second register Reg_2. When the load current information LCI of the selected regulator is stored in registers, the control logic 150 may transmit a ready signal Ready to the load device 200. After that, the load device 200 may fetch the load current information LCI stored in the register through the interface unit 170.

According to control of the control logic 150, the interrupt generator 160 generates the ready signal Ready and supplies the ready signal Ready to the load device 200. In response to the ready signal Ready from the interrupt generator 160, the load device 200 may fetch or be ready to receive the load current information LCI.

The interface unit (or interface) 170 may substantially exchange data with the load device 200. The interface unit 170 may serve the sense request signal S_EN of the load current and the control signal CNTL served from the load device 200 to the control logic 150 with a data form or a signal form. Furthermore, the interface unit 170 may serve an interface where the load device 200 is able to access to the load current information LCI stored in a register of the control logic 150. For example, the interface unit 170 may be an interface device such as a mobile industry processor interface (MIPI), a peripheral component interconnect express (PCIe), a serial advanced technology attachment (SATA), and a universal serial bus (USB), which is sharable with a mobile application processor.

According to the above-described PMIC 100, the regulators included in the PMIC 100 include a current meter. Moreover, when measurement and calculation of the load current of the regulator selected from the load device 200 is complete, the PMIC 100 stores the load current in a register Reg_n (e.g., 1≤n≤I) included in the control logic 150 as load current information LCI. The load current information LCI stored in the register Reg_n may be supplied to the load device 200.

Figure 3:
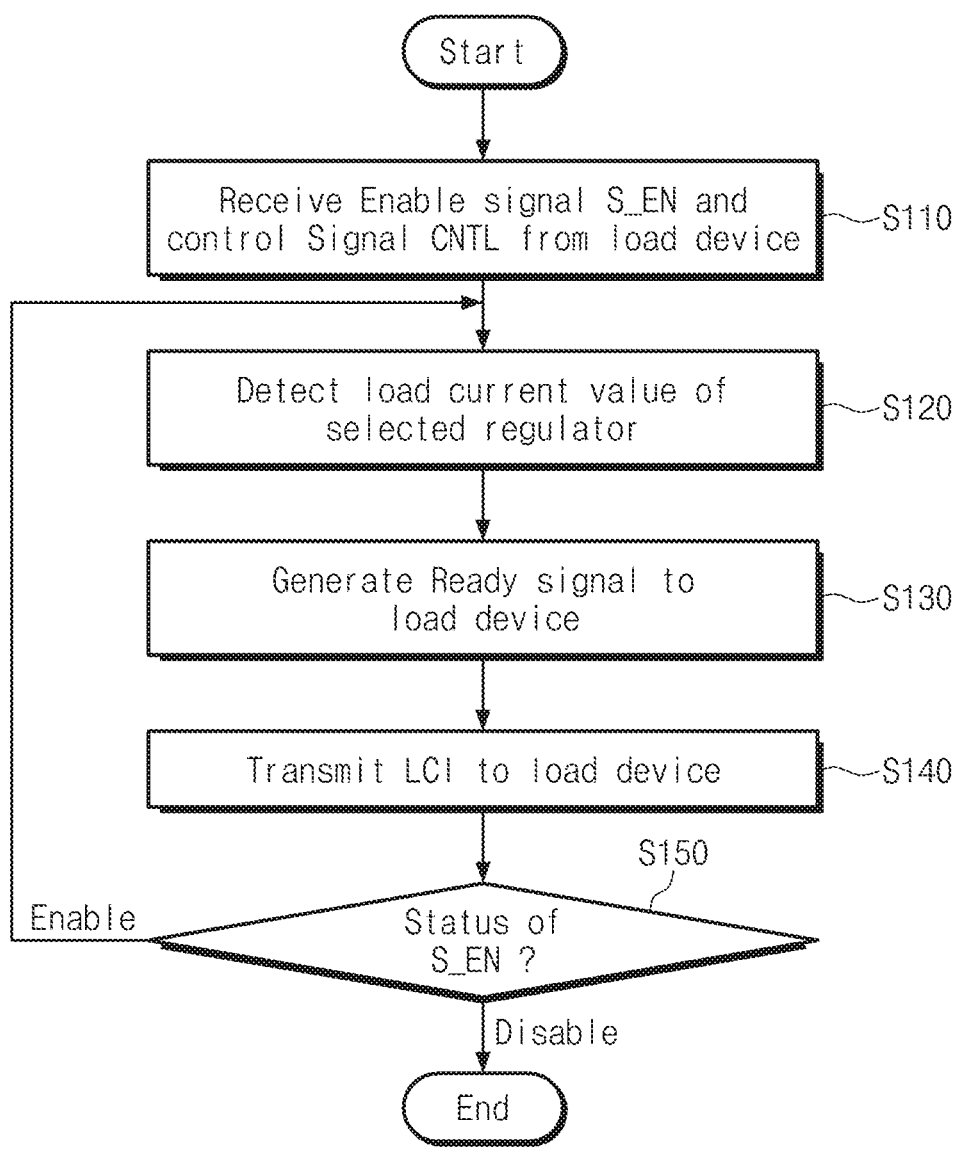
FIG. 3 is a flow chart briefly illustrating an operation of a PMIC 100 according to at least one example embodiment of the inventive concepts.

FIG. 3 is a flow chart briefly illustrating an operation of a PMIC 100 according to at least one example embodiment of the inventive concepts. Referring to FIG. 3, a method for generating and serving load current information LCI of a selected regulator according to request of the load device 200 by the PMIC 100 is described.

In operation S110, the PMIC 100 receives a sense request signal S_EN of load current and a control signal CNTL from the load device 200. The control signal CNTL may include selection information for selecting a regulator requested by the load device 200 and configuration information for measuring the load current. For example, the control signal CNTL may include information such as form information of a regulator, sampling period information, and an averaging time. Here, the selection information includes a signal for selecting a regulator to currently supply power or a regulator for measuring magnitude of the load current. The sampling period information is time information for measuring the load current from a current meter. Moreover, the average time may include time information for calculating an average value of a discontinuous (or varying) current such as output current of a switching regulator.

In operation S120, the PMIC 100 selects a sense signal LCI_j from the current meter of each of the plurality of regulators 110 and 120, and detect a load current value of a selected regulator. The sense signal LCI_j selected by the selector 130 may be transformed into code data by ADC 140. Here, to select at least one of the sense signals LCI_1~LCI_N of the plurality of regulators, the selection information supplied from the load device 200 may be used. The selection information is included in the control signal CNTL.

When the regulators are selected, the sense signal LCI_j of each of the selected regulators is sequentially transmitted to the ADC 140 and transformed into digital data. Moreover, the load current information LCI transformed into the digital data may be stored in registers Reg_1 to Reg_i included in the control logic 150.

In operation S130, the control logic 150 may control an interrupt generator 160 to inform the load device 200 that measurement and transmission of the load current information LCI requested from the load device 200 is complete. The interrupt generator 160 transmits a ready signal Ready to the load device 200 according to control of the control logic 150.

In operation S140, the load current information LCI is transmitted to the load device 200 by a fetch operation of the load device 200. Here, the load current information LCI may be directly transmitted to the load device 200 by the PMIC 100 as well as the fetch operation of the load device 200. Afterward, the load device 200 may perform thermal throttling, a power control operation, a dynamic voltage and frequency scaling (DVFS) using the real-time load current information LCI.

In operation S150, the control logic 150 checks a state of the sense request signal S_EN transmitted from the load device 200. When the sense request signal S_EN is activated, the procedure moves to the S120 operation. That is, the control logic 150 may continue to measure load current with respect to the selected regulator. On the other hand, when the sense request signal S_EN is deactivated, measurement of load current and a supply operation of the real-time load current information LCI with respect to the selected regulator are terminated.

A function of the PMIC 100 to supply the load current information LCI requested from the load device 200 in real time is described as above. To perform a specific operation based on magnitude of the load current in the load device 200, magnitude information of the load current served in real time is desired. The PMIC 100 according to at least one example embodiment of the inventive concepts may measure magnitude of current substantially consumed in a load through regulators installing a current meter. Moreover, the PMIC 100 may serve the load current information LCI speedily measured whenever the load device 200 requests the load current information LCI.

In accordance with including a current meter in the PMIC 100, precision of current measurement affected from various environments may increase. Furthermore, power consumption generated when measuring current using a resistor component outside the PMIC 100 may be mitigated (or alternatively, prevented).

Figure 4:
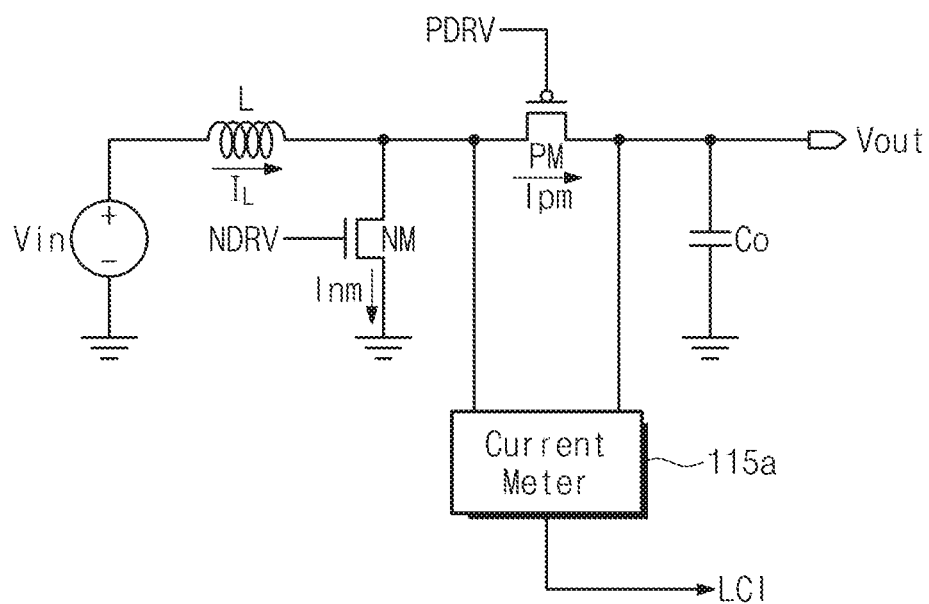
FIG. 4 is a circuit diagram illustrating a switching regulator including a current meter according to at least one example embodiment of the inventive concepts.

FIG. 4 is a circuit diagram illustrating a switching regulator including a current meter according to at least one example embodiment of the inventive concepts. Referring to FIG. 4, a boost converter 110*a* is displayed as an example of a switching regulator. The boost converter 110*a* is a kind of a switching regulator for supplying higher output voltage than input voltage. The boost converter 110*a* according to at least one example embodiment of the inventive concepts includes a current meter for measuring current Ipm of a PMOS transistor corresponding to load current I_load.

The boost converter 110*a* according to at least one example embodiment of the inventive concepts briefly includes an inductor L, switch stages NM and PM, an output capacitor Co, and a current meter 115*a*. Power Vin supplied with DC voltage is connected to a terminal of the inductor L. For example, the power Vin may be supplied by a battery. Moreover, in response to driving signals PDRV and NDRV, the switch stages NM and PM may be composed of a p-channel metal oxide semiconductor (PMOS) transistor PM and an n-channel metal oxide semiconductor (NMOS) transistor NM, which complementarily turn on or turn off. Current to flow to the inductor L by switching of the PMOS transistor PM and the NMOS transistor NM is regulated and is supplied to a load side. Here, if the output capacitor Co is great, pulsation of the output voltage Vout is suppressed and is outputted with a DC form.

The current meter 115*a* according to at least one example embodiment of the inventive concepts may be composed to measure current to flow to the PMOS transistor PM. The current meter 115*a* measures current to flow to the PMOS transistor PM. That is, the current meter 115*a* may detect a voltage difference of a drain-source terminal of the PMOS transistor PM and calculate current to flow to the PMOS transistor PM. Moreover, the current meter 115*a* may calculate an average of discontinuous (or varying) channel current of the PMOS transistor PM. The average may be supplied as the load current information LCI that denotes magnitude of the load current. Here, the load current information LCI may be supplied as a voltage or current level or code data.

The load current substantially supplied to a load in the boost converter 110*a* is not inductor current $I_L$ to flow to the inductor L but current Ipm to flow to the PMOS transistor PM to supply current to a load side. Accordingly, the current meter 115*a* measures the channel current of the PMOS transistor PM and calculates an average value of the channel current. The average value may be used as magnitude of the load current I_load.

Figure 5:
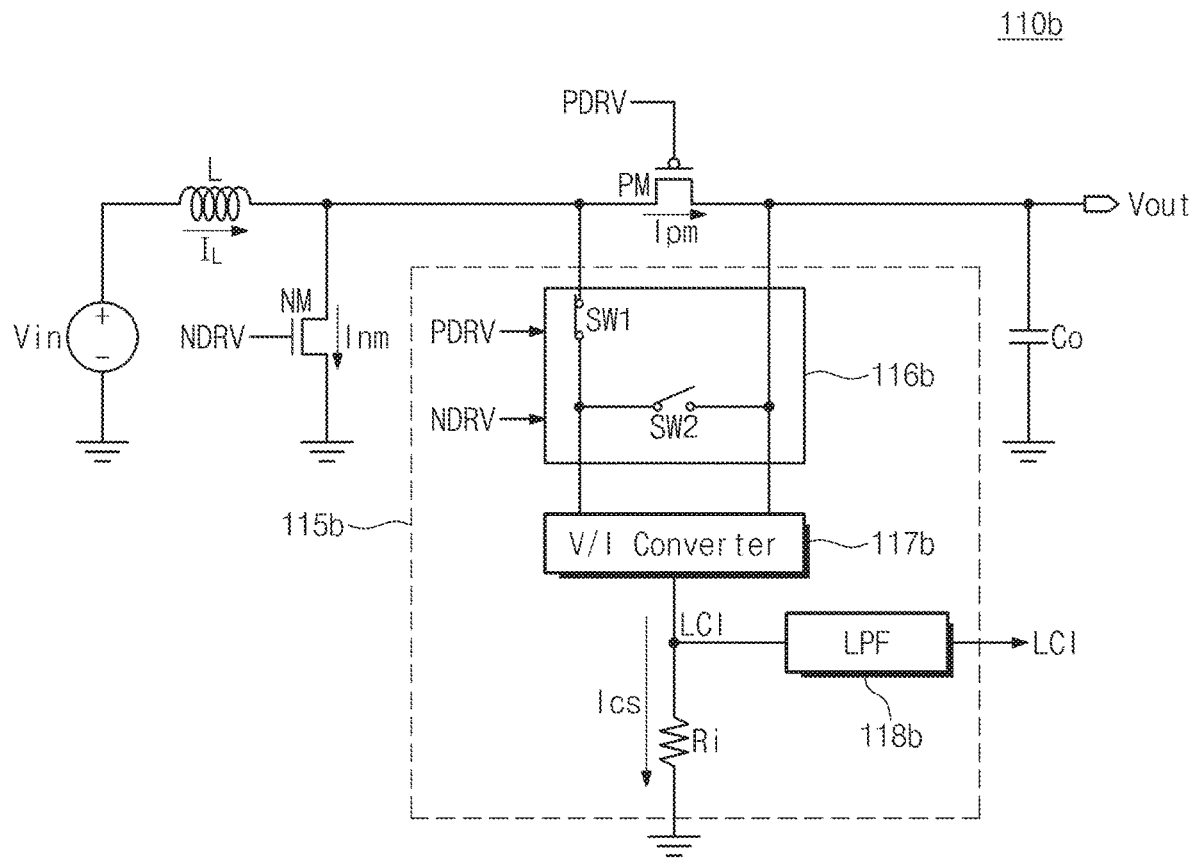
FIG. 5 is circuit diagram specifically illustrating a switching regulator including a current meter shown in FIG. 4.

FIG. 5 is circuit diagram specifically illustrating a switching regulator including a current meter shown in FIG. 4. Referring to FIG. 5, the boost converter 110*b* includes a current meter 115*b* for measuring channel current Ipm of a PMOS transistor PM corresponding to load current I_load.

As described above, the boost converter 110*b* is the same as a boost converter 110*a* of FIG. 4. Accordingly, an operation description with respect to an inductor L, switches NM and PM, and an output capacitor Co that are included in the boost converter 110*b* is omitted.

The current meter 115*b* may include an input selection unit (or input selector) 116*b*, a voltage-current converter 117*b*, a resistor Ri, and a low pass filter (LPF) 118*b*. The selection unit 116*b* supplies drain-source voltage to the voltage-current converter 117*b* as differential voltage when the PMOS transistor PM is turned on. On the other hand, the input selection unit 116*b* may supply the differential voltage of 0 V to the voltage-current converter 117*b* when the PMOS transistor PM is turned off.

For this operation, a first switch SW1 should be turned on and a second switch SW2 should be turned off, when the PMOS transistor PM is turned on (i.e., when PDRV is a low level). On the contrary, a first switch SW1 should be turned off and a second switch SW2 should be turned on, when the PMOS transistor PM is turned off (i.e., when PDRV is a high level). Here, driver signals PDRV and NDRV for driving the PMOS transistor PM and the NMOS transistor NM may be supplied with the same signal or the same level.

When the PMOS transistor PM is turned on, the voltage-current converter 117*b* detects differential voltage of the drain-source terminal of the PMOS transistor PM and transforms the detected differential voltage into a current signal. For example, the differential voltage of the drain-source terminal of the PMOS transistor PM may be transformed into current using a resistor of the same magnitude as a resistor of the PMOS transistor PM included in the voltage-current converter 117*b*. Here, current Ics outputted by the voltage-current converter 117*b* flows to the resistor Ri. Moreover, the current to flow to the resistor Ri is detected as a voltage value and supplied as the load current information LCI averaged by the LPF 118*b*. Here, the LPF 118*b* may use at least one of various smoothing circuits.

As above, an example of the current meter 115*b* for measuring the channel current Ipm of the PMOS transistor PM having the same magnitude as the load current I_load is described. However, a current measurement method or a configuration of the current meter 115*b* may be variously changed. The current meter 115*b* may be only included in the PMIC 100 and measure the load current in real time.

Figure 6:
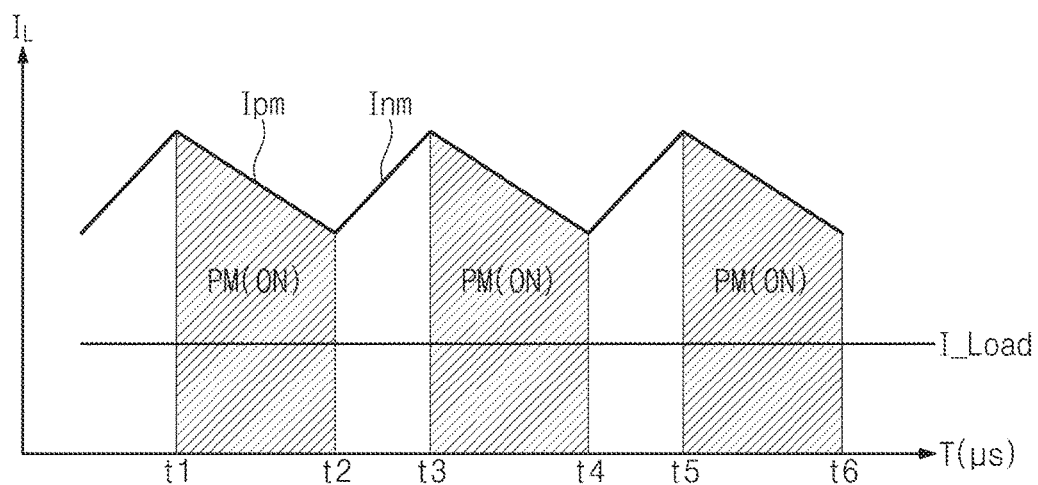
FIG. 6 is a waveform diagram briefly illustrating an operation of current meter shown in FIG. 5.

FIG. 6 is a waveform diagram briefly illustrating an operation of current meter shown in FIG. 5. Referring to FIG. 6, the current meter 116*b* may only measure current of the PMOS transistor PM and may serve the measured current as load current I_load through an average operation.

Firstly, referring to a waveform of inductor current IL to flow to an inductor L, the inductor current IL is changed by a switching operation of switch stages PM and NM. Before T0 time, it is assumed that a NMOS transistor NM is turned on and the PMOS transistor PM is turned off. Here, the inductor current IL vertically increases. In T1 time, the NMOS transistor NM is turned off and the PMOS transistor PM is turned on. Here, current Ipm to flow to the PMOS transistor PM may contribute the load current I_load.

Voltage or current of a proper level may be continuously supplied as a load by complementarily switching of the NMOS transistor NM and the PMOS transistor PM through this method. Especially, the current Ipm of the PMOS transistor PM to contribute to the load current I_load is a part drawn with a diagonal line. Accordingly, the current Ipm of the PMOS transistor PM of the part drawn with a diagonal line is discontinuous. Magnitude of this discontinuous current is supplied as a DC component accompanied by an averaging operation. Accordingly, magnitude of the load current I_load substantially supplied as the load may be served by averaging the current Ipm when the PMOS transistor PM is turned on with respect to a period (e.g., t1 to t3).

The current meter 115b according to an embodiment of the inventive concept may measure the current Ipm of the PMOS transistor PM, which is discontinuously supplied in the PMIC 100. Moreover, magnitude information of the load current measured by the current meter 115b may be supplied to the load device 200 in real time.

Figure 7:
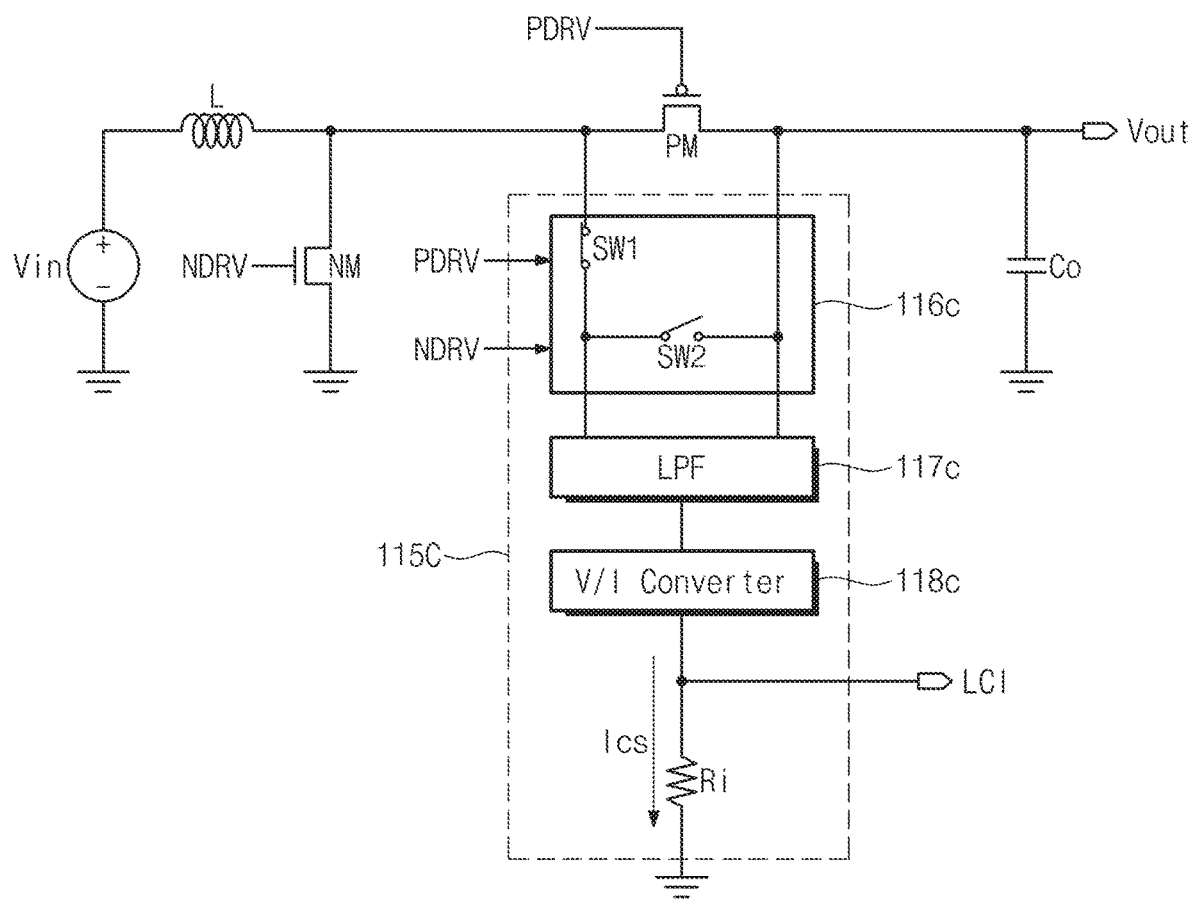
FIG. 7 is a circuit diagram illustrating another example of a switching regulator including a current meter shown in FIG. 4.

FIG. 7 is a circuit diagram illustrating another example of a switching regulator including a current meter shown in FIG. 4. Referring to FIG. 7, a boost converter 110c includes a current meter 115c for measuring channel current Ipm of a PMOS transistor PM corresponding to load current I_load.

As described above, the boost converter 110c is substantially equal to a boost converter 110b shown in FIG. 5 except for the current meter 115c. Accordingly, a concrete operation description with respect to an inductor L, switch stages NM and PM, and an output capacitor Co that are included in the boost converter 110c is omitted here.

The current meter 115c may include an input selection unit 116c, a LPF 117c, a voltage-current converter 118c, and a resistor Ri. The selection unit 116c supplies drain-source voltage to the voltage-current converter 118c as differential voltage, when the PMOS transistor PM is turned on. On the other hand, the input selection unit 116c supplies the differential voltage of 0 V to the voltage-current converter 118c, when the PMOS transistor PM is turned off.

For this operation, a first switch SW1 is turned on and a second switch SW2 is turned off, when the PMOS transistor PM is turned on (i.e., when PDRV is a low level). On the contrary, a first switch SW1 is turned off and a second switch SW2 is turned on, when the PMOS transistor PM is turned off (i.e., when PDRV is a high level).

The LPF 117c may be a smoothing circuit for averaging the differential voltage of the drain-source terminal of the PMOS transistor PM. The LPF 117c may output the differential voltage of the drain-source terminal with respect to a period with an averaging magnitude, when the PMOS transistor PM is turned on. For example, the LPF 117c may include a resistor R and a capacitor C. The LPF 117c may average discontinuous voltage and output the averaged voltage as a voltage value successive on time axis.

The voltage-current converter 118c transforms continuous voltage outputted from the LPF 117c into a current signal. For example, the voltage-current converter 118c may transform the averaged value of differential voltage of the drain-source terminal of the PMOS transistor PM into current Ics using a resistor having the same size as a resistor of the PMOS transistor PM included in the voltage-current converter 118c. Here, current signal Ics outputted by the voltage-current converter 118c flows to the resistor Ri. Moreover, voltage is detected by the current to flow to the resistor Ri. The detected voltage may be served as the load current information LCI.

Figure 8:
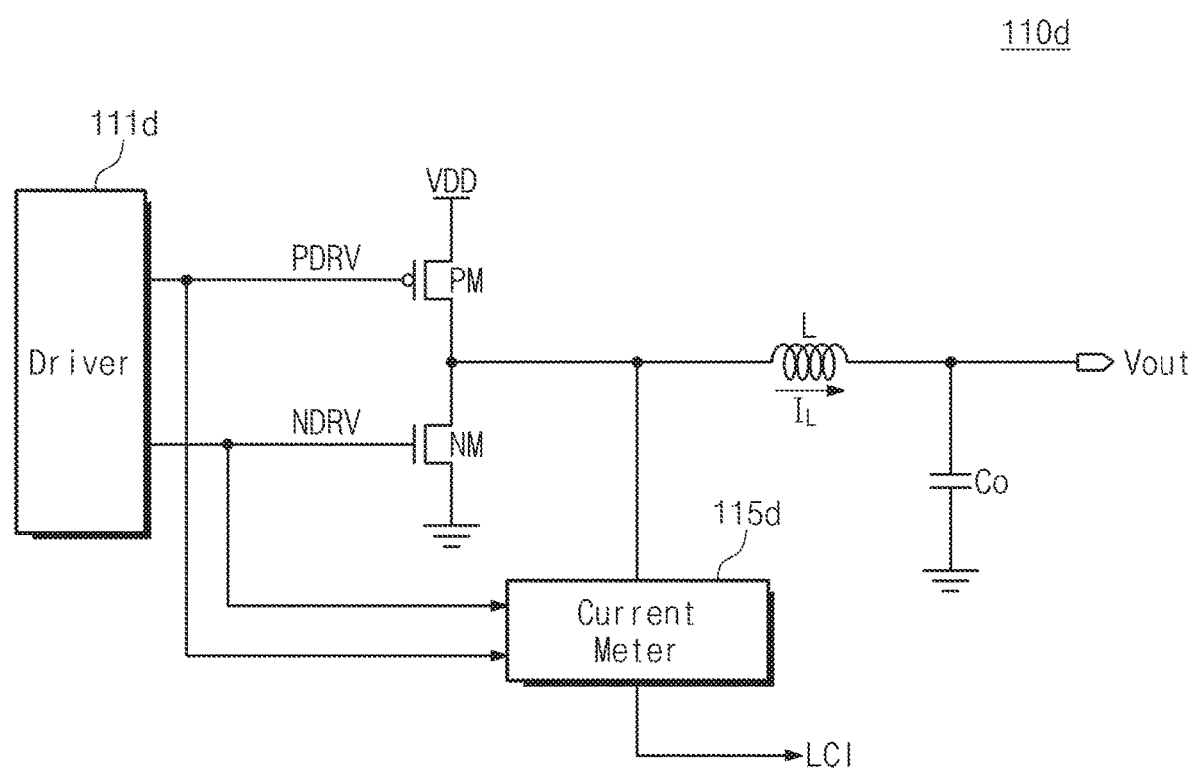
FIG. 8 is a circuit diagram illustrating a switching regulator according to at least one example embodiment of the inventive concepts.

FIG. 8 is a circuit diagram illustrating a switching regulator according to at least one example embodiment of the inventive concepts. Referring to FIG. 8, a switching regulator 110d composed of a buck converter may include a current meter 115d.

One terminal of a PMOS transistor PM may be connected to a node for receiving input voltage VDD. A NMOS transistor NM may be connected between the other terminal of the PMOS transistor PM and a ground node. Each of the PMOS transistor PM and the NMOS transistor NM may be controlled by a first driving signal PDRV and a second driving signal NDRV. The switching regulator 110d may include a driver 111d for serving the first driving signal PDRV and the second driving signal NDRV.

A level of output voltage Vout may be determined by the first driving signal PDRV and the second driving signal NDRV generated by the driver 111d. That is, the driver 111d may control charge and discharge with respect to an inductor L and an output capacitor Co with a pulse width modulation method and control the level of the output voltage Vout. For example, as a duty ratio of the first driving signal PDRV is small, charging time of the inductor L lengthens. Accordingly, energy stored in the inductor L increases and the output voltage Vout relatively increases. On the other hand, as the duty ratio of the first driving signal PDRV is great (i.e., as a low level interval shortens), charging time of the inductor L shortens. Accordingly, energy stored in the inductor L is relatively reduced and the output voltage Vout may relatively lower.

The PMOS transistor PM and the NMOS transistor NM may be sequentially turned on in response to each of the first driving signal PDRV and the second driving signal NDRV. Here, the first driving signal PDRV and the second driving signal NDRV may be served as the same signal. A ratio of an input voltage VDD and the output voltage Vout may be determined by a duty ratio of the first driving signal PDRV and the second driving signal NDRV.

The current meter 115d may substantially measure output current of the switching regulator 110d and may serve the measured output current as load current information LCI. The current meter 115d may detect current supplied through the PMOS transistor PM and the NMOS transistor NM and serve the average value as load current I_load. To obtain an average of current to flow to the inductor L, the current meter 115d may refer driving signals PDRV and NDRV. That is, to obtain time average of inductor current IL, the current meter 115d may use switching time of the driving signals PDRV and NDRV.

The current meter 115d may average current to flow to the inductor L and measure load current. Furthermore, to speedily calculate load current I_load, the current meter 115d may achieve the load current I_load using a peak value of the inductor current $I_L$, and the driving signals PDRV and NDRV. That is, the current meter 115d may achieve the load current I_load using the peak value of the inductor current $I_L$ generated by the PMOS transistor PM and the NMOS transistor NM and switching time information. Moreover, the current meter 115d may serve the load current information LCI using the calculated load current I_load.

Figure 9:
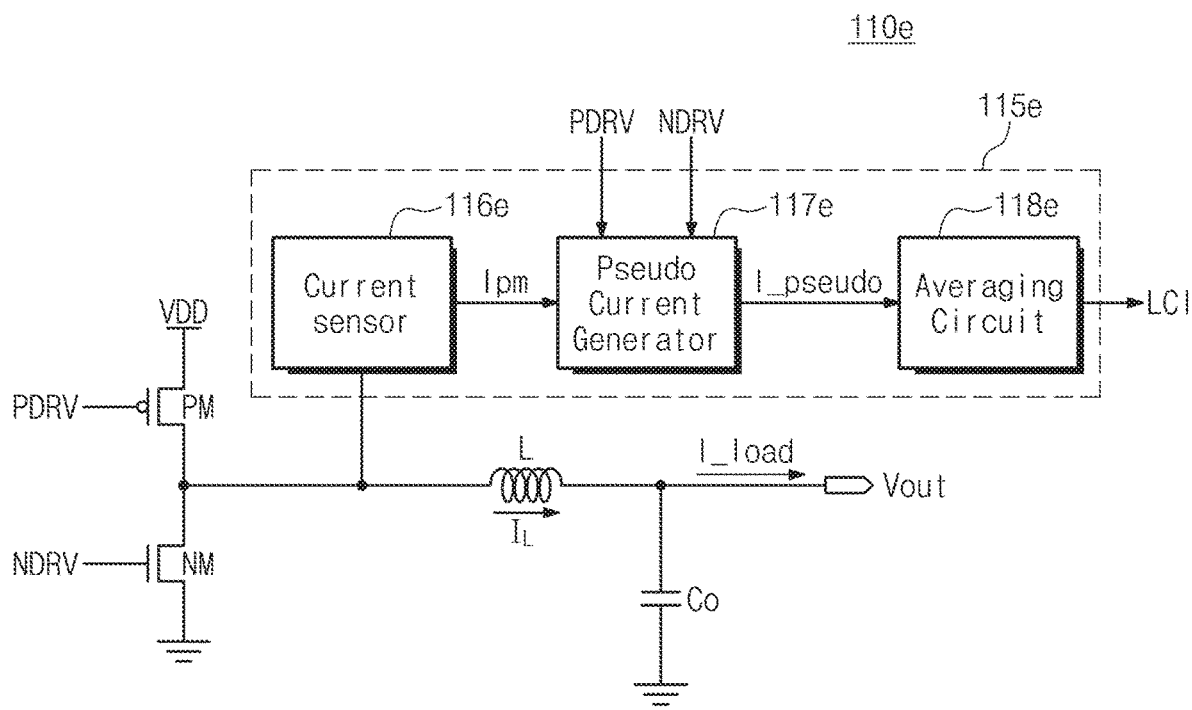
FIG. 9 is a diagram illustrating an example embodiment of a switching regulator shown in FIG. 8.

FIG. 9 is a diagram illustrating an example embodiment of a switching regulator shown in FIG. 8. Referring to FIG. 9, a switching regulator 110e composed of a buck converter may include a current meter 115e.

One terminal of a PMOS transistor PM may be connected to a node for receiving input voltage VDD. A NMOS transistor NM may be connected between the other terminal of the PMOS transistor PM and a ground node. Each of the PMOS transistor PM and the NMOS transistor NM may be controlled by a first driving signal PDRV and a second driving signal NDRV. As not shown, the switching regulator 110e may include a driver for serving the first driving signal PDRV and the second driving signal NDRV.

The PMOS transistor PM and the NMOS transistor NM may be sequentially turned on in response to each of the first driving signal PDRV and the second driving signal NDRV. Moreover, to prevent inductor current IL from declining below '0', the first driving signal PDRV and the second driving signal NDRV may be served in order that all of the PMOS transistor PM and the NMOS transistor NM are turned off.

A ratio of input voltage VDD and the output voltage Vout may be determined by a duty ratio of the first driving signal PDRV and the second driving signal NDRV.

The current meter 115e may measure output current of the switching regulator 110e and serve the measured output current as load current information LCI. The current meter 115e may include a current sensor 116e, a pseudo current generator 117e, and an averaging circuit 118e. However, this configuration is an example, but a real-time measurement of load current may be possible with various methods.

The current sensor 116e may detect the inductor current IL to flow to an inductor L. Moreover, the current sensor 116e may be served as a sensor for only measuring current to flow to the PMOS transistor PM or a sensor for only measuring current to flow to the NMOS transistor NM. Here, the current sensor 116e may be served with a configuration to only detect peak current. For example, the current sensor 116e may detect current Ipm to flow to the PMOS transistor PM using the same configuration as a current meter 115b shown in FIG. 5 or a current meter 115c shown in FIG. 7.

The pseudo current generator 117e detects a peak value of detection current supplied from the current sensor 116e. Moreover, the pseudo current generator 117e may generate pseudo current I_pseudo with a square wave form using a detected peak current Ipeak, the first driving signal PDRV and the second driving signal NDRV. Here, the pseudo current generator 117e may include a peak detector for detecting the peak current Ipeak supplied from the current sensor 116e. That is, to compose the peak detector, the pseudo current generator 117e may include a capacitor for transforming a level of detected current into a voltage value and storing a peak value of the transformed voltage. However, the configuration of the peak detector is not limited hereto, but various transformations may be possible.

The pseudo current generator 117e may be composed of a square wave current generator for mapping current with a triangular wave form to current with a square wave form having an equivalence current value. Here, the pseudo current I_pseudo may be outputted with a current wave form of a square wave form, which has the same period as a transition period of the first driving signal PDRV and the second driving signal NDRV.

The averaging circuit 118e may average the pseudo current I_pseudo with a square wave form and output the averaged pseudo current I_pseudo as load current I_load. That is, the averaging circuit 118e may get a result value where an averaging operation is performed as the load current I_load during a period of the pseudo current I_pseudo. After that, a level of the load current I_load may be transformed into the load current information LCI.

Figure 10:
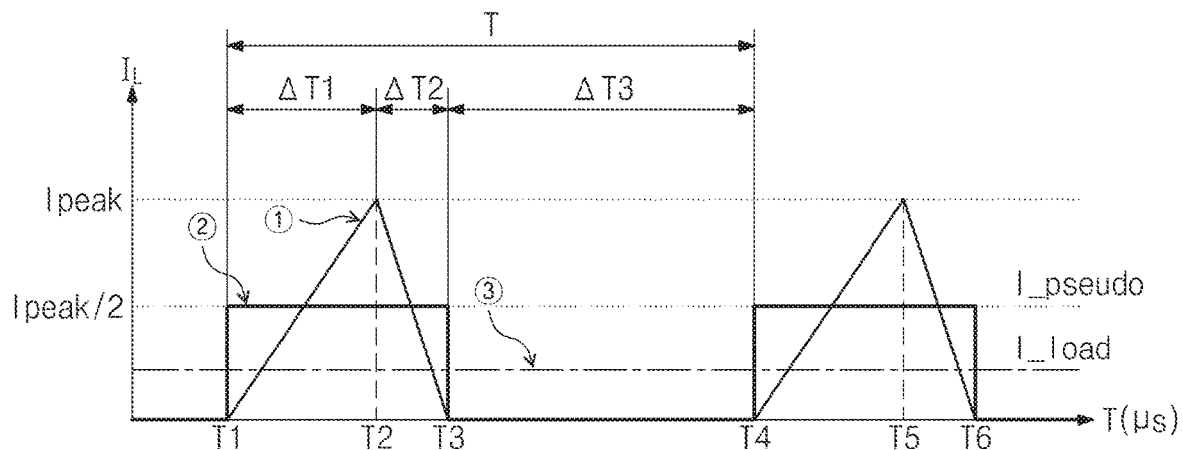
FIG. 10 is a waveform diagram briefly illustrating an operation of a current meter 115e shown in FIG. 9.

FIG. 10 is a waveform diagram briefly illustrating an operation of a current meter 115e shown in FIG. 9. Referring to FIG. 10, the current meter 115e detects a peak value of inductor current IL and generates pseudo current I_pseudo. Moreover, the current meter 115e may output an average value of the pseudo current I_pseudo as load current I_load.

The inductor current IL may be generated with a triangle wave form displayed with a withdrawal mark ①. The inductor current IL may linearly increase in an interval (i.e., from T1 to T2) when the PMOS transistor PM is turned on. Moreover, the inductor current IL goes to a peak value at T2 time. After that, the inductor current $I_L$ may decrease in an interval (i.e., from T2 to T3) when the PMOS transistor PM is turned off and the NMOS transistor NM is turned on.

Likewise, the inductor current $I_L$ may remain zero current in an interval (i.e., from T3 to T4) when the PMOS transistor PM is turned off and the NMOS transistor NM is turned off, because charged induced current is discharged before the interval (i.e., from T3 to T4). After T4 time, a waveform of the inductor current IL may periodically remain with the same waveform through this method. The current sensor 116e may detect a peak value Ipeak of the inductor current IL.

The pseudo current generator 117e may detect time ΔT1 when the PMOS transistor PM is turned on and time ΔT2+ΔT3 when the NMOS transistor NM is turned on. Furthermore, the pseudo current generator 117e may detect zero time T3 of the inductor current IL. A level of the pseudo current I_pseudo, a pulse width, and a period T may be calculated by this detection operation of the pseudo current generator 117e. A waveform of the pseudo current I_pseudo calculated by the pseudo current generator 117e is displayed with withdrawal sign ②.

However, the pseudo current I_pseudo with a square wave form may not be supplied with load current. Accordingly, the pseudo current I_pseudo is supplied to the averaging circuit 118e. The averaging circuit 118e averages the pseudo current I_pseudo with a square wave form with a total period T. This operation may be calculated by an operation for dividing current corresponding to an area of a square wave having a rectangle form by the period T. The calculated load current I_load is displayed with a withdrawal sign ③.

As above, magnitude of output current of a switching regulator may be easily measured according to a method of calculating the load current I_pseudo performed from the current meter 115e according to an embodiment of the inventive concept. Here, detection of a peak value of the inductor current IL may be performed by the current sensor 116e or the pseudo current generator 117e.

Figure 11:
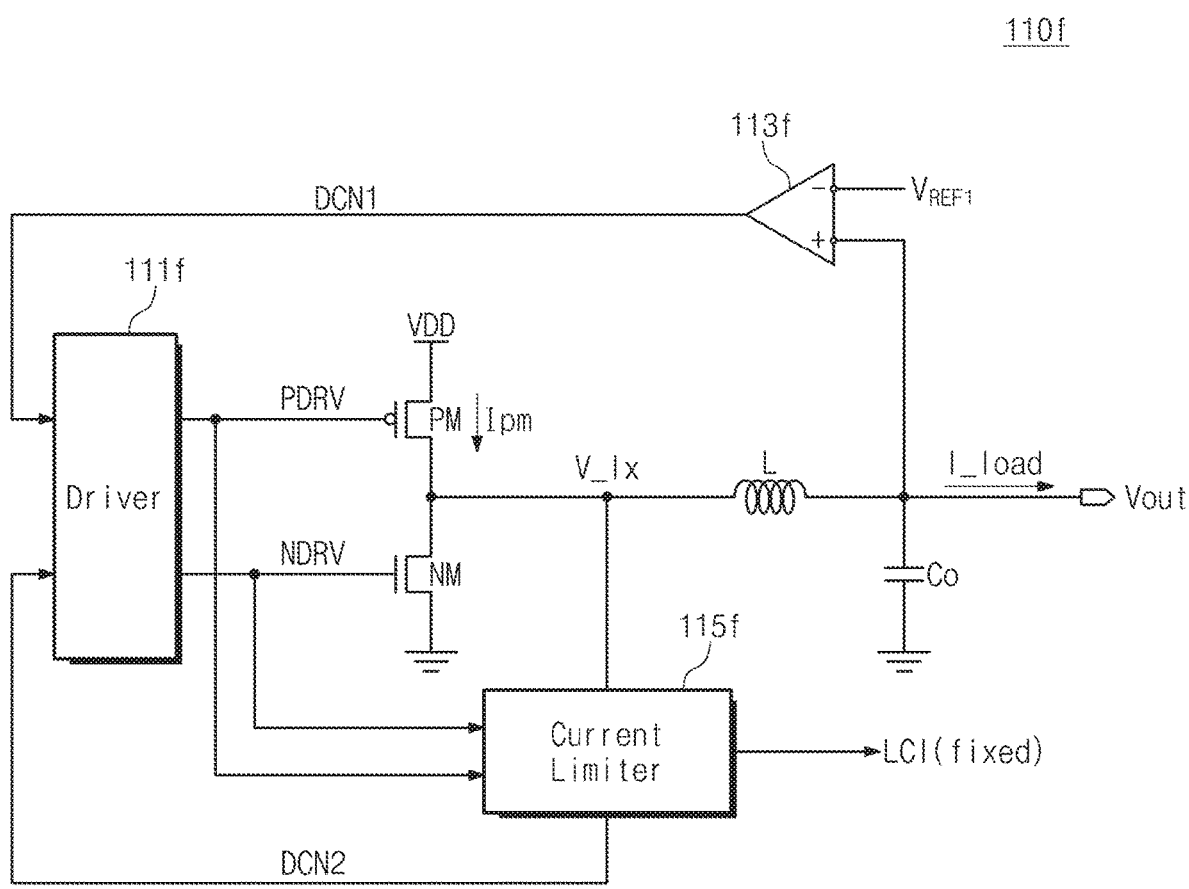
FIG. 11 is a circuit diagram illustrating a switching regulator according to at least one example embodiment of the inventive concepts.

FIG. 11 is a circuit diagram illustrating a switching regulator according to at least one example embodiment of the inventive concepts. Referring to FIG. 11, a switching regulator 110f composed of a buck converter may include a current limiter 115f for serving load current information LCI. Moreover, the switching regulator 110f may include a driver 111f controlled by a second driving control signal DCN2 served from the current limiter 115f. Furthermore, the switching regulator 110f may be driven with a discontinuous conduction mode (DCM). The switching regulator 110f may include a comparator 113f for monitoring output voltage Vout.

One terminal of the PMOS transistor PM may be connected to a node for supplying input voltage VDD. The NMOS transistor NM may be connected between the other terminal of the PMOS transistor PM and a ground node. Each of the PMOS transistor PM and the NMOS transistor NM may be controlled by a first driving signal PDRV and a second driving signal NDRV. The switching regulator 110f may include the driver 111f for serving the first driving signal PDRV and the second driving signal NDRV.

A level of the output voltage Vout may be determined by the first driving signal PDRV and the second driving signal NDRV generated by the driver 111f. That is, the driver 111f may control charge and discharge with respect to the inductor L and an output capacitor Co with a pulse width modulation method and control the level of the output voltage Vout. In response to each of the first driving signal PDRV and the second driving signal NDRV, the PMOS transistor PM and the NMOS transistor NM may be sequentially turned on As described above, the PMOS transistor PM and the NMOS transistor NM may be turned off at the same time by the first driving signal PDRV and the second driving signal NDRV. A ratio between input voltage VDD and output voltage Vout may be determined by control of the PMOS transistor PM and the NMOS transistor NM.

The comparator 113f generates a first driving control signal DCN1 for controlling the driver 111f according to the DCM. The comparator 113f may output the first driving control signal DCN1 by detecting a state where the output voltage Vout is lower than a reference voltage $V_{REF1}$. The driver 111f may output the first driving signal PDRV and the second driving signal NDRV to turn off all of the PMOS transistor PM and the NMOS transistor NM based on the first driving control signal DCN1 from the comparator 113f.

The current limiter 115f fixes a peak value of the inductor current $I_L$ with a constant level. That is, because the peak value Ipeak of the inductor current $I_L$ Is fixed, an operation for calculating the pseudo current I_pseudo and an average value thereof may be much simplified. The current limiter 115f compares the peak value Ipeak of the inductor current $I_L$ with a reference value. Moreover, the current limiter 115f may control the driver 111f using the compared result.

That is, the current limiter 115f may control switching of first driving signal PDRV and the second driving signal NDRV so that the peak value Ipeak of the inductor current $I_L$ may not exceed the reference value. The current limiter 115f may generate the first driving control signal DCN1 for controlling the driver 111f. Furthermore, the current limiter 115f may serve load current information LCI based on the fixed peak value. Here, the peak value Ipeak of the inductor current IL may be adjusted by various configuration information.

Figure 12:
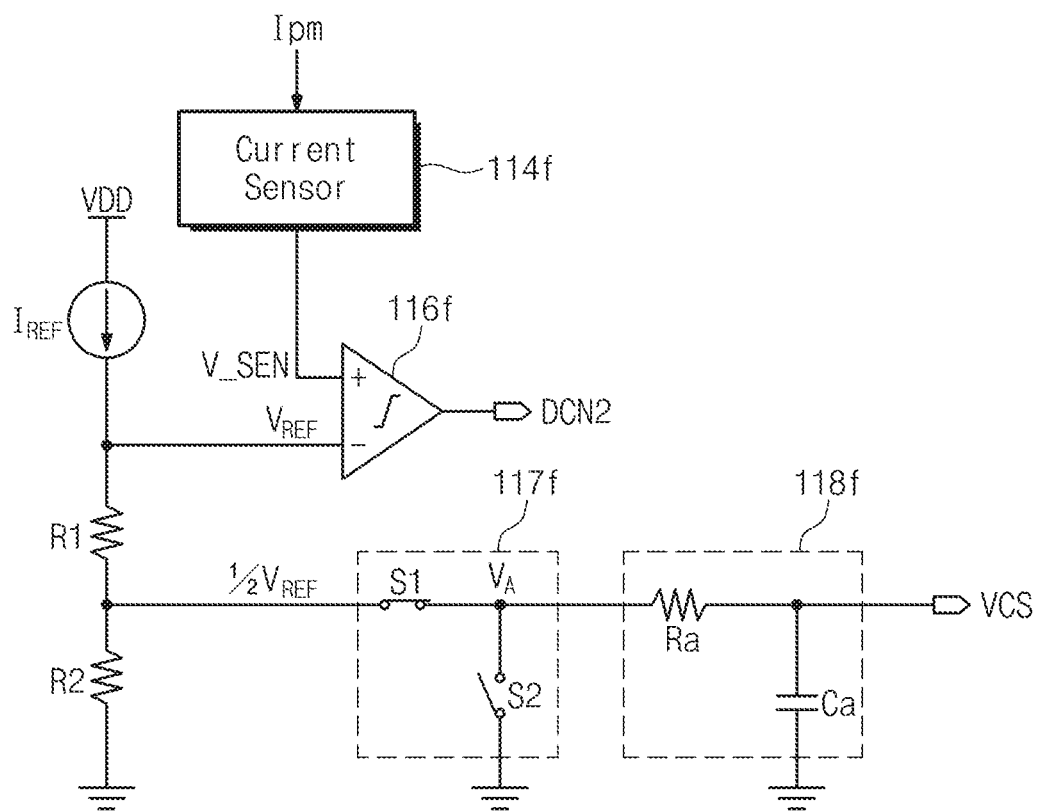
FIG. 12 is a circuit diagram briefly illustrating an example configuration of a current limiter 115f shown in FIG. 11.

FIG. 12 is a circuit diagram briefly illustrating an example configuration of a current limiter 115f shown in FIG. 11. Referring to FIG. 12, the current limiter 115f may include reference current $I_{REF}$, distribution resistors R1 and R2, a current sensor 114f, a comparator 116f, a switch stage 117f, and a LPF 118f.

The current sensor 114f may detect current Ipm to flow to the PMOS transistor PM. The current sensor 114f outputs current sensing voltage V_SEN including magnitude information of current to flow to the PMOS transistor PM.

Each of reference voltage $V_{REF}$ and distributed reference voltage $0.5V_{REF}$ is applied to the distribution resistors R1 and R2 by the reference current power $I_{REF}$. The distributed reference voltage $0.5V_{REF}$ is set, when magnitude of the distribution resistors R1 and R2 is identical. When the current sensing voltage V_SEN corresponding to magnitude of current to flow to the PMOS transistor PM is higher than the reference voltage $V_{REF}$, the second control signal DCN2 may be outputted to turn off the PMOS transistor PM. Accordingly, the PMOS transistor PM is turned off. On the other hand, when the current sensing voltage V_SEN is equal to the reference voltage $V_{REF}$ or higher than the reference voltage $V_{REF}$ or, the second control signal DCN2 for turning on the PMOS transistor PM may be generated.

The PMOS transistor PM and the NMOS transistor NM may perform a switching operation for generating output voltage according to DCM by the first driving control signal DCN1 and the second driving control signal DCN2. Finally, supply current of the switching regulator 110f may be constantly remain by configuration of the reference current IREF.

Moreover, the current limiter 115f may include the switch stage 117f for generating a square wave current of a level corresponding to a half of current of a peak value. Switches S1 and S2 of the switch stage 117f are controlled according to a driving signal PDRV or a driving signal NDRV. That is, when the PMOS transistor PM is turned on, a first switch S1 is turned on and a second switch S2 is turned off. When all of the PMOS transistor PM and the NMOS transistor NM are turned on, the first switch S1 is turned off and the second switch S2 is turned on. That is, voltage VA of an output terminal node of the switch stage 117f may be substantially transformed into a level of the pseudo current I_pseudo.

Output voltage $V_A$ of the switch stage 117f may be generated with an average value by the LPF 118f. Here, output voltage Vcs of the LPF 118f may be served as load current information LCI.

Figure 13:
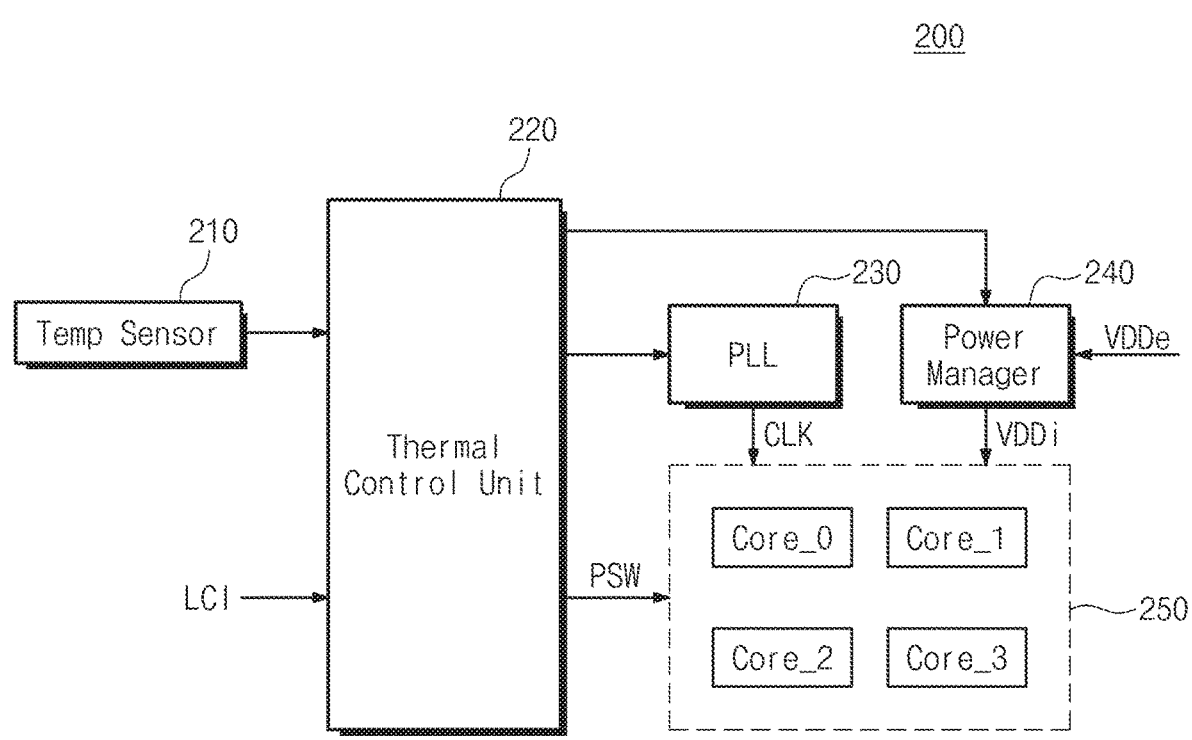
FIG. 13 is a block diagram illustrating an example of a load device shown in FIG. 1.

FIG. 13 is a block diagram illustrating an example load device shown in FIG. 1. Referring to FIG. 13, the load device 200 may include a temperature sensor 210, a thermal control unit 220 for requesting and receiving load current information LCI, a clock generator 230, a power manager 240, and a processing unit (or processor) 250 (i.e., a special purpose processor).

The temperature sensor 210 senses internal temperature of the load device 200. For example, the temperature sensor 210 may include a thermal electromotive force type sensor (e.g., a thermocouple sensor) to use electromotive force changed according to temperature and a temperature conductive type sensor to sense magnitude of a resistor changed according to temperature. However, a temperature measurement method of the temperature sensor 210 is not limited hereto but may be variously applied. The temperature sensor 210 transmits a sensed temperature value to the thermal control unit (or thermal controller) 220.

The thermal control unit 220 may control a level of driving voltage VDD or frequency of a driving clock CLK based on the internal temperature. For example, when the internal temperature of the load device 200 increases more than a reference value, the thermal control unit 220 may control the power manager 240 to lower the level of the driving voltage VDD. Further, when the internal temperature of the load device 200 increases more than a reference value, the thermal control unit 220 may control the clock generator 230 (e.g., a PLL) to lower the frequency of the driving clock CLK.

Moreover, the thermal control unit 220 may a switching signal PSW for cutting off driving voltage VDD of the processing unit 250 based on internal temperature of the load device 200. The thermal throttling is a technique for controlling driving voltage VDD or a driving clock CLK that are supplied to the processing unit 250 by the thermal control unit 220, as the internal temperature of the load device 200 increases. Especially, the thermal control unit 220 may perform a thermal throttling operation based on the real-time load current information LCI served from the PMIC 100 shown in FIG. 1.

The clock generator 230 generates the driving clock CLK for driving the load device 200. The generated driving clock CLK is served to the processing unit 250. The processing unit 250 performs various operations in synchronization with the driving clock CLK. The clock generator 230 may be implemented with a phase loop lock (PLL) and various types of clock generation circuits may be used as the clock generator 230 according to at least one example embodiment of the inventive concepts. The clock generator 230 may change frequency of the driving clock CLK generated according to control of the thermal control unit 220.

The power manager 240 transmits external voltage VDDe supplied from external device to the processing unit 250 according to control of the thermal control unit 220. The power manager 240 adjusts a level of the external power VDDe supplied from the outside of the load device 200 and supplies driving voltage VDDi to the processing unit 250. The power manager 240 steps up or step down the external voltage VDDe. When the external voltage VDDe is lower than a voltage level (i.e., VDDi) (e.g., 2.0 V) required by the load device 200, the power manager 240 may boost the external voltage VDDe and supply the boosted external voltage VDDe to the processing unit 250. On the other hand, when the external voltage VDDe is higher than a voltage level required by the processing unit 250, the power manager 240 may lower the external voltage VDDe and supply the lowered external voltage VDDe to the processing unit 250.

The processing unit 250 is circuits for performing various operations according to data or a control signal. The processing unit 250 may include various circuits for performing various functions of the load device 200. The processing unit 250 may be implemented with a single-core processor. However, the processing unit 250 may be implemented with a homogeneous multi-core processor or a heterogeneous multi-core processor. The multi-core processor is a computing component having at least two processors (hereafter, "core") that independently operate. Each of cores may independently read and perform program instructions.

During progress of the thermal throttling, driving voltage of the processing unit 250 and frequency of a driving clock may be adjusted. Moreover, during progress of the thermal throttling, body bias voltage supplied to a body of a PMOS transistor and a NMOS transistor may be adjusted.

The load device 200 according to an embodiment of the inventive concept may perform thermal throttling based on load current information LCI served from the PMIC 100. To operating thermal throttling, the thermal control unit 220 may receive the load current information LCI from the PMIC 100 in real time.

Figure 14:
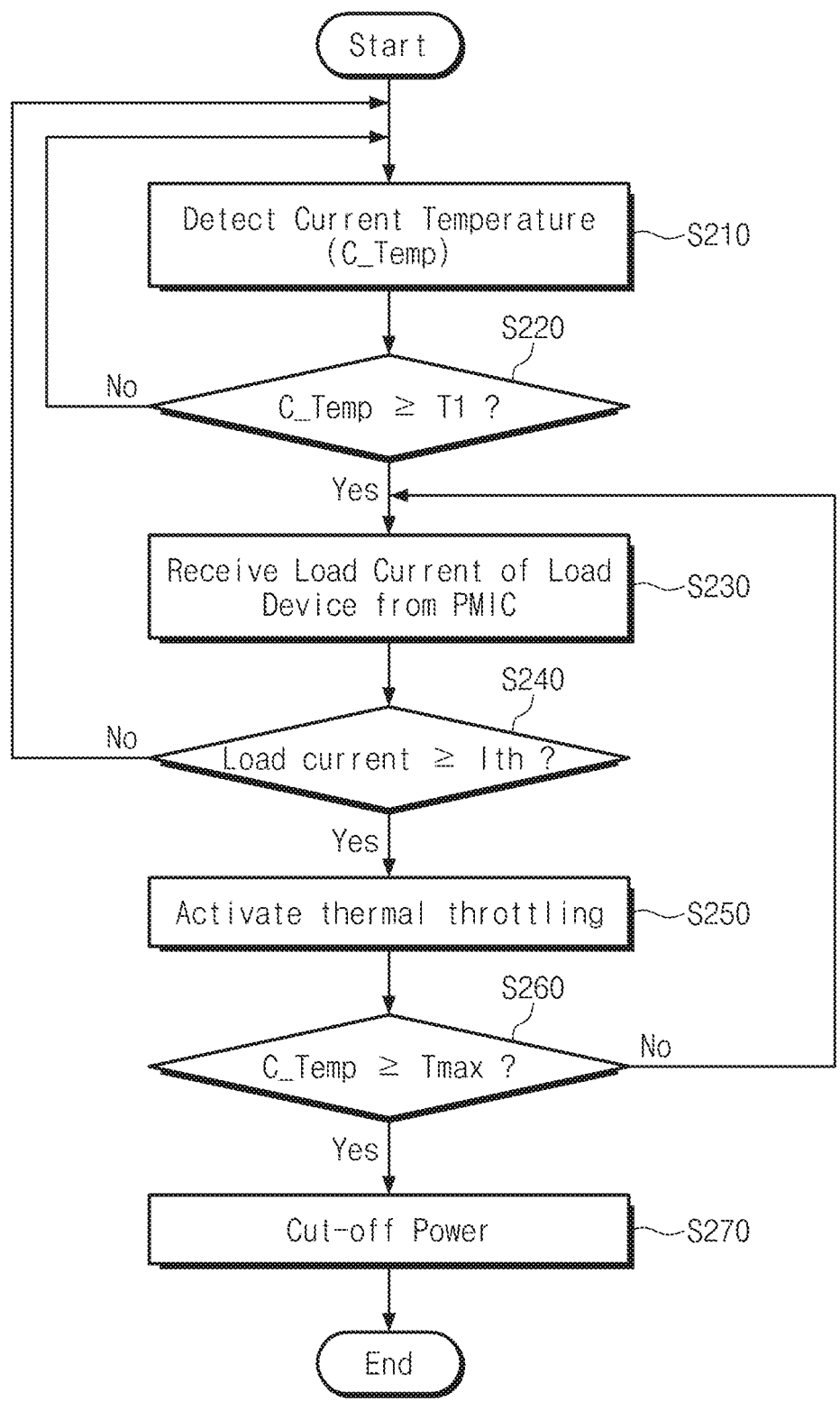
FIG. 14 is a flowchart illustrating a method of temperature control performed for a load device according to at least one example embodiment of the inventive concepts.

FIG. 14 is a flowchart illustrating a method of temperature control performed for a load device at least one example embodiment of the inventive concepts. Referring to FIG. 14, a thermal control unit 220 shown in FIG. 13 may currently perform a thermal throttling operation based on the real-time load current information LCI of a load device 200.

In operation S210, the thermal control unit 220 detects internal temperature C_Temp of the load device 200. The thermal control unit 220 perceives the internal temperature C_Temp based on real-time temperature data served from a temperature sensor 210.

In operation S220, the thermal control unit 220 determines whether the internal temperature C_Temp of the load device 200 increases more than a first reference value T1. When the internal temperature C_Temp is lower than the first reference value T1, the thermal control unit 220 returns to S210 operation. That is, when the internal temperature C_Temp is lower than the first reference value T1, the thermal control unit 220 may not perform a Thermal Throttling operation. On the other hand, when the internal temperature C_Temp is equal to the first reference value T1 or higher than the first reference value T1, the thermal control unit 220 moves to S230 operation.

In operation S230, the thermal control unit 220 requests load current information LCI to a PMIC 100. Moreover, the thermal control unit 220 receives the load current information LCI served from the PMIC 100.

In operation S240, the thermal control unit 220 detects whether magnitude of load current is above a reference value Ith or not. If the magnitude of load current is below the reference value Ith (i.e., No direction), a procedure moves to S210 operation. On the other hand, if the magnitude of load current is above the reference value Ith (i.e., Yes direction), the procedure moves to S250 operation.

In operation S250, the thermal control unit 220 activates a thermal throttling operation. To perform the thermal throttling operation, the thermal control unit 220 may perform various control operations for suppressing temperature increase by lowering a level of consumption power. For example, the thermal control unit 220 may control the power manager 240 to reduce a level of the driving voltage VDDi. Further, to activate the thermal throttling operation, the thermal control unit 220 may control the power manager 240 to lower frequency of a driving clock CLK. To activate the thermal throttling operation, the thermal control unit 220 may control the clock generator 230 and the power manager 240 to adjust the level of the driving voltage VDD and the frequency of a driving clock CLK at the same time.

In operation S260, the thermal control unit 220 may detects a variation of temperature in activating the thermal throttling. The thermal control unit 220 may determine whether the internal temperature C_Temp served from the temperature sensor 210 is included in a temperature range. When the internal temperature C_Temp is lower than the maximum value Tmax, the procedure moves to S230. On the other hand, when the internal temperature C_Temp is higher than the maximum value Tmax, the procedure moves to S270.

In operation S270, the thermal control unit 220 may supply a switching signal PSW and cut off the driving voltage VDD supplied to the processing unit 250. Circuit damage of the processing unit 250 caused by high temperature may be reduced (or alternatively, prevented) by cutting off the driving voltage VDD in advance. Moreover, an operation for backing data and an operating state of the processing unit 250 up may be performed prior to cutting off the driving voltage VDD.

As above, the load device 200 according to at least one example embodiment of the inventive concepts may implement a thermal throttling operation based on present load current according to a temperature control method. The inventive concept may perform a precise thermal throttling, compared to a thermal throttling that uses a prediction value according to a thermal throttling operation that uses magnitude of present load current supplied in real time.

Figure 15:
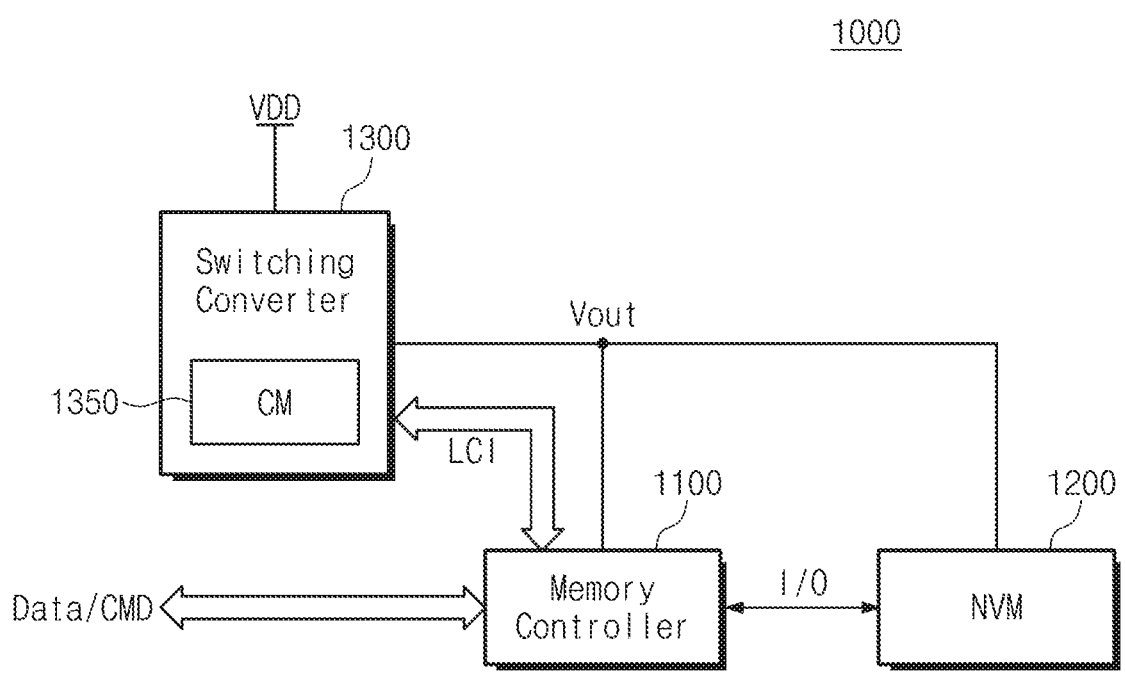
FIG. 15 is a block diagram briefly illustrating a memory system according to at least one example embodiment of the inventive concepts.

FIG. 15 is a block diagram briefly illustrating a memory system according to at least one example embodiment of the inventive concepts. Referring to FIG. 15, the memory system 1000 includes a memory controller 1100, a nonvolatile memory 1200, and a switching regulator 1300. Here, the switching regulator 1300 may be served as a PMIC.

The switching regulator 1300 includes a current meter (CM) 1350 therein. Moreover, the switching regulator 1300 may serve load current information LCI according to request of the memory controller 110. The memory system 1000 for applying this technique may perform a temperature control operation using the real-time load current information LCI.

Figure 16:
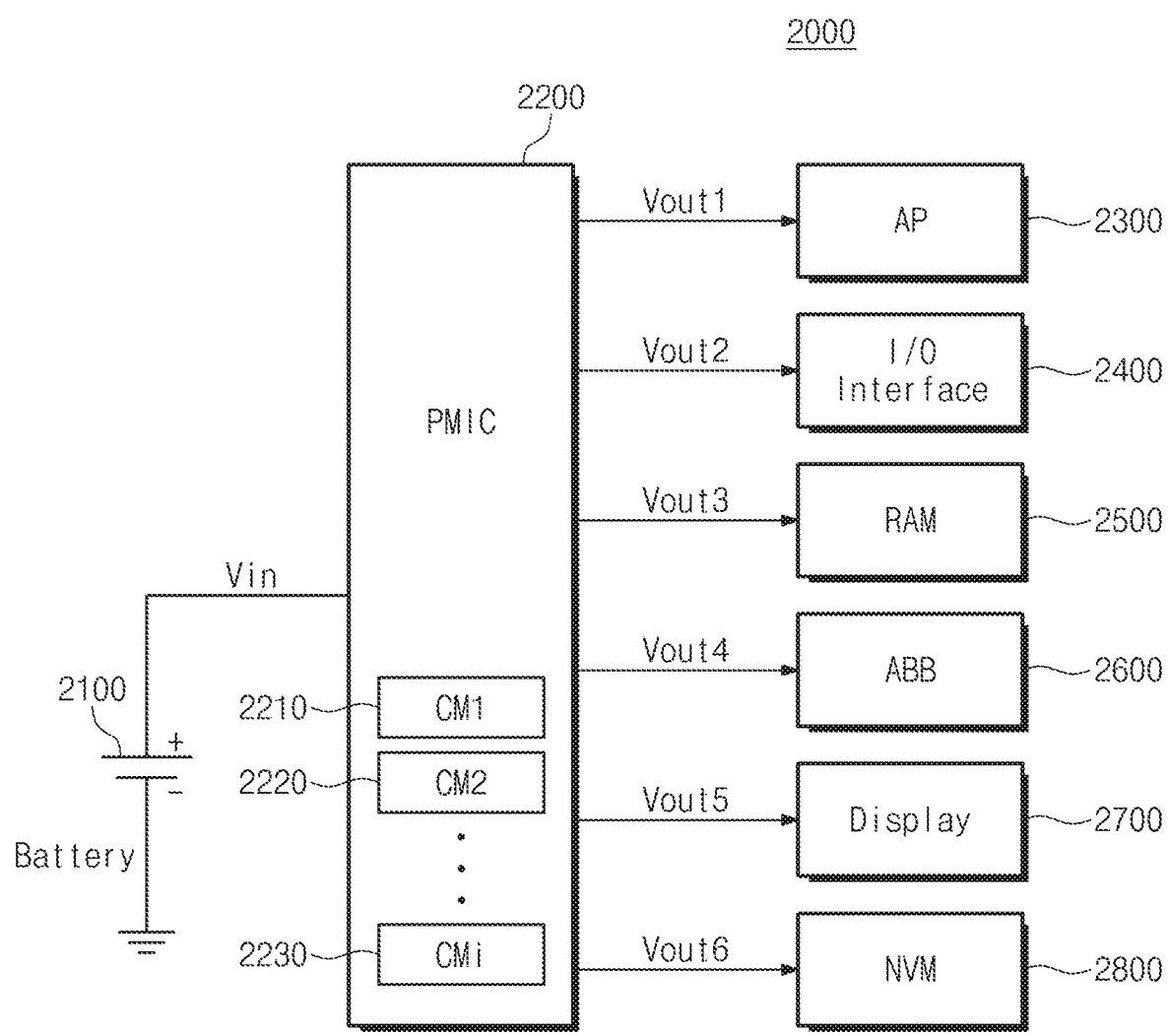
FIG. 16 is a block diagram briefly illustrating a mobile device according to at least one example embodiment of the inventive concepts.

FIG. 16 is a block diagram briefly illustrating a mobile device according to at least one example embodiment of the inventive concepts. Referring to FIG. 16, the mobile device 2000 according to an embodiment of the inventive concept may include a battery 2100, a PMIC 2200, an application processor (AP) 2300, an input/output interface unit (or input/output interface) 2400, a random access memory (RAM) 2500, an analog baseband chipset (ABB) 2600, a display device 2700, a nonvolatile memory 2800.

The PMIC 2200 transforms power voltage VDD supplied from the battery 2100 into various levels Vout1 to Vout6 and supplies the power voltage VDD having various levels Vout1 to Vout6 to various load devices. Here, the PMIC may include a plurality of regulators. The plurality of regulators may include a switching regulator or a LDO regulator. Moreover, each of the regulators may include current meters 2210 to 2230 as shown. The PMIC 2200 may serve the load current information LCI measured according to request of at least one of load devices.

A semiconductor device according to an embodiment of the inventive concept may be installed using a package of various forms. For example, a semiconductor and/or a controller may be installed using packages such as a package on package (PoP), a ball grid arrays (BGAs), a chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a thin quad flat pack (TQFP), a system in package (SIP), a multi chip package (MCP), a wafer-level fabricated package (WFP), and a wafer-level processed stack package (WSP).

While the inventive concepts have been described with reference to example embodiments, it will be apparent to those skilled in the art that various changes and modifications may be made without departing from the spirit and scope of the inventive concepts. Therefore, it should be understood that the above example embodiments are not limiting, but illustrative.

What is claimed is:

1. A method of managing power based on load information, the method comprising:
    requesting, by a load device, load information from a power management integrated circuit (PMIC), the request including selection information, the selection information identifying one of a plurality of regulators in the PMIC and including information regarding a time or parameter for calculating a respective average current;
    measuring, by the PMIC, an output current of the identified regulator, the identified regulator supplying power to the load device;
    providing, by the PMIC, output current information as the load information to the load device; and
    performing, by the load device, a performance improvement operation based on the load information.

2. The method of claim 1, wherein the load information is load current information.

3. The method of claim 1, wherein the load information is real-time load information.

4. The method of claim 1, further comprising:
    performing, by the load device, a temperature control operation based on the load information.

5. The method of claim 1, wherein when a magnitude of the output current of the identified regulator increases, both power consumption and a temperature of the load device increase.

6. The method of claim 1, wherein the PMIC includes a current meter configured to measure the output current of the identified regulator.

7. The method of claim 6, wherein the output current of the identified regulator varies, and the current meter averages the varying output current of the identified regulator.

8. The method of claim 1, further comprising:
    detecting whether a driving temperature of the load device exceeds a reference value.

9. The method of claim 1, wherein the performance improvement operation is a thermal throttling operation, a power control operation, or a dynamic voltage and frequency scaling (DVFS) operation.

10. A device comprising:
    a power management integrated circuit (PMIC) including a plurality of regulators, the PMIC configured to measure an output current of one of the plurality of regulators; and
    a load device configured to
    transmit a control signal to the PMIC requesting load information from the PMIC, the control signal including selection information, the selection information identifying one of a plurality of regulators in the PMIC and including information regarding a time or parameter for calculating a respective average current, and
    perform a performance improvement operation based on the load information,
    wherein each of the plurality of regulators is configured to supply power to the load device, and
    the PMIC is configured to
    provide output current information as the load information to the load device.

11. The device of claim 10, wherein each of the plurality of regulators includes a current meter configured to measure the output current of the respective regulator.

12. The device of claim 10, wherein the load information is real-time load current information.

13. The device of claim 10, wherein the load device is configured to perform a temperature control operation based on the load information.

14. The device of claim 10, wherein the performance improvement operation is a thermal throttling operation, a power control operation, or a dynamic voltage and frequency scaling (DVFS) operation.

15. A device comprising:
    a power management integrated circuit (PMIC) including a plurality of regulators and a current meter, the current meter being configured to measure an output current outputted from one of the plurality of regulators; and
    a load device configured to request load current information from the PMIC and configured to perform a performance improvement operation based on the load current information,
    wherein each of the plurality of regulators is configured to supply power to the load device,
    the PMIC is configured to provide the output current as the load current information to the load device, and
    the load device is configured to provide selection information to the PMIC, the selection information for selecting one of the plurality of regulators and including information regarding a time or parameter for calculating a respective average current.

16. The device of claim 15, wherein the load device is configured to provide configuration information to the PMIC, the configuration information for measuring the output current of one of the plurality of regulators.

17. The device of claim 15, wherein the PMIC includes an interface configured to receive request information from the load device and to supply the load current information to the load device.

18. The device of claim 15, wherein the PMIC includes an interrupt generator configured to supply a ready signal to the load device when a detection of the load current information is complete.

19. The device of claim 15, wherein the PMIC includes:
- a selector configured to select the load current information of each of the plurality of regulators; and
- a control logic configured to control the selector and to store the load current information.

20. The device of claim 15, wherein the load current information is real-time load information.

\* \* \* \* \*